United States Patent
Rangan et al.

[11] Patent Number: 6,147,634
[45] Date of Patent: Nov. 14, 2000

[54] METHOD AND APPARATUS FOR DIGITAL TO ANALOG CONVERSION WITH REDUCED NOISE

[75] Inventors: Giri N Rangan; Mathew A Rybicki, both of Austin, Tex.

[73] Assignee: Sigmatel, Inc., Austin, Tex.

[21] Appl. No.: 09/211,616

[22] Filed: Dec. 15, 1998

[51] Int. Cl.[7] .................................................. H03M 3/00
[52] U.S. Cl. ...................................... 341/143; 341/144
[58] Field of Search ..................................... 341/143, 144

[56] References Cited

U.S. PATENT DOCUMENTS

| | | |
|---|---|---|
| 5,027,120 | 6/1991 | Thurston .................................. 341/143 |
| 5,349,352 | 9/1994 | Saleh ....................................... 341/143 |
| 5,392,042 | 2/1995 | Pellon ...................................... 341/143 |
| 5,606,319 | 2/1997 | Yatim et al. ............................. 341/144 |
| 5,608,400 | 3/1997 | Pellon ...................................... 341/143 |

*Primary Examiner*—Brian Young
*Assistant Examiner*—Jason L. W. Kost

[57] ABSTRACT

A method and apparatus for digital to analog signal conversions with reduced noise include processing that begins by receiving a digital signal and filtering the digital signal to produce a filtered digital signal. The filtering is tuned to attenuate components of the digital signal having frequencies near one-half the sampling rate frequency and to pass other components of the digital signal having frequencies away from one-half the sampling rate frequency. The filtered signals are then converted to analog signals based on a clock signal having a sampling rate frequency and a voltage reference.

11 Claims, 4 Drawing Sheets

METHOD AND APPARATUS FOR DIGITAL TO ANALOG CONVERSION WITH REDUCED NOISE

TECHNICAL FIELD OF THE INVENTION

This invention relates generally to digital to analog signal conversions and more particularly to reducing noise within digital to analog converters and applications thereof.

BACKGROUND OF THE INVENTION

The conversion of analog to digital signals and digital to analog signals is known. Conversion of analog to digital signals may be done utilizing Sigma Delta Modulators, successive approximations and/or flash circuits. The conversion of digital signals to analog signals may be done using complimentary circuitry to Sigma Delta Modulators, successive approximation circuits, and/or flash circuits.

A Sigma Delta analog to digital converter (ΣΔADC) includes a first or second order Sigma Delta Modulator and a quantizer. As is known, a first order Sigma Delta Modulator includes a single modulation stage while a second order Sigma Delta Modulator includes two modulation stages. To regulate the Sigma Delta Modulator, the output of the quantizer is fed back to each stage of the said Sigma Delta Modulator via digital to analog converter modules. While ΣΔADC provide a relatively high-speed analog to digital conversion there are some limitations for high fidelity applications. For instance, when the analog signal is a DC value for a relatively long time (much greater than the sampling rate), a noise component having a frequency of one-half the switching frequency is present. The noise can be injected into a voltage reference signal applied to the digital to analog converter feedback module and propagates through the ADC due to imperfections in the parts comprising the ADC. For example, amplifiers within the Sigma Delta ADC include offset that allow the noise to pass.

In many Sigma Delta Modulator ADC, this noise is of minimal consequence since the analog input is rarely, if ever, a DC value for a significant period of time. In digital audio applications, a DC analog signal may be present for a sufficient period of time causing the noise signal to be produced. Typically, the noise produced will be in the audio range thereby being rendered audible by the audio equipment.

Therefore, a need exists for a method and apparatus that substantially reduces one-half sampling frequency noise that is generated when the analog input to a Sigma Delta ADC is a DC value.

DETAILED DESCRIPTION OF A PREFERRED EMBODIMENT

Generally, the present invention provides a method and apparatus for digital to analog signal conversions with reduced noise. Such processing begins by receiving a digital signal and filtering the digital signal to produce a filtered digital signal. The filtering is tuned to attenuate components of the digital signal having frequencies near one-half the sampling rate frequency and to pass other components of the digital signal having frequencies away from one-half the sampling rate frequency. The filtered signals are then converted to analog signals based on a clock signal having the sampling rate frequency and a voltage reference. With such a method and apparatus, when the digital signal is substantially comprised of components near half the sampling rate frequency, the analog signal has minimum noise components having frequencies near half the sampling rate frequency. In other words, when the digital signal is substantially a square wave signal having a frequency of approximately one-half the sampling rate frequency, the filter attenuates noise produced near the one-half sampling rate frequency such that the resulting analog signal has a low noise component at one-half the sampling rate frequency.

Figure 1:
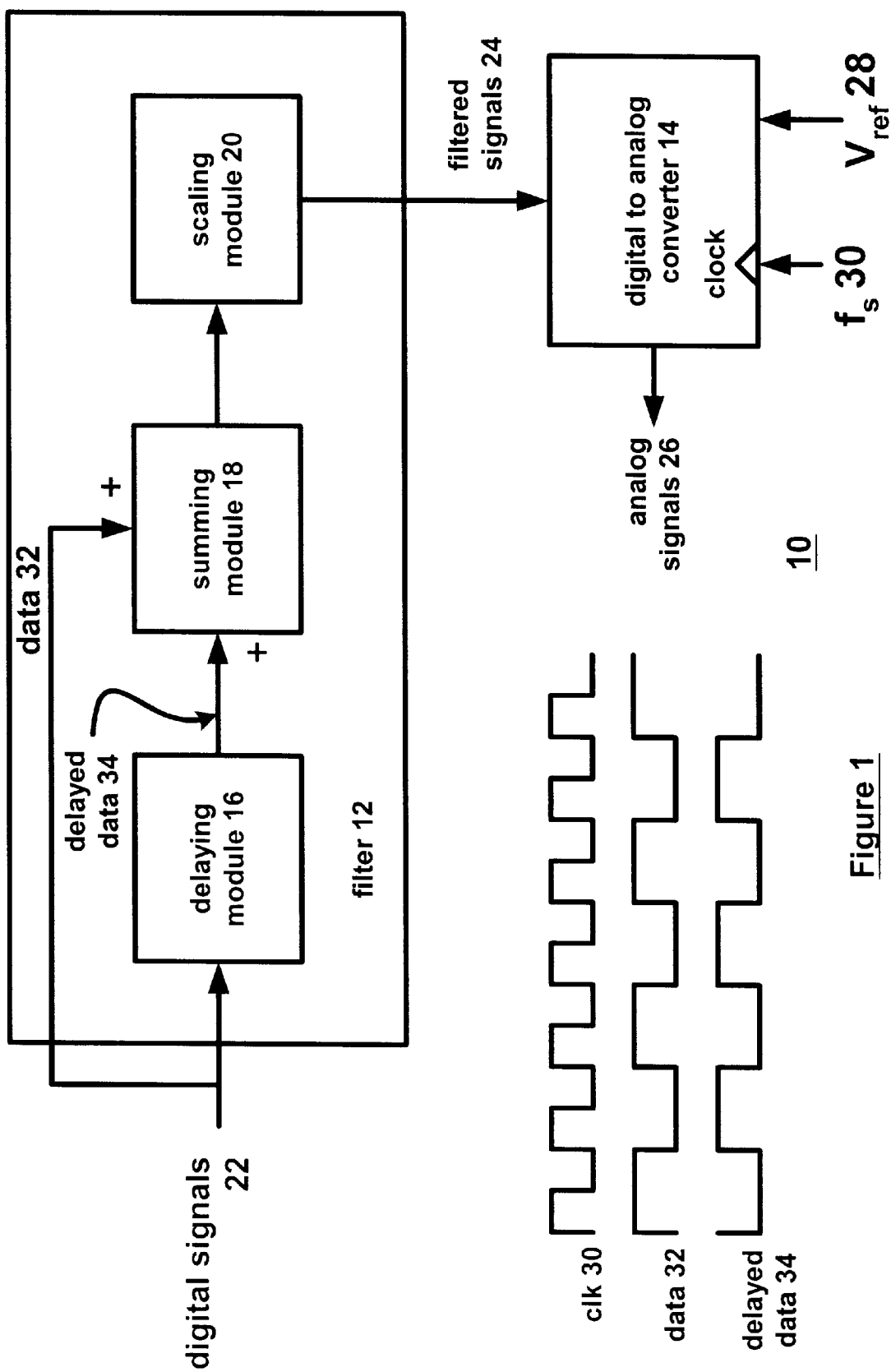
FIG. 1 illustrates a schematic block diagram of a digital to analog converter in accordance with the present invention.

The present invention can be more fully described with reference to FIGS. 1 through 5. FIG. 1 illustrates a schematic block diagram of a digital to analog converter 10 that includes a filter 12 and a digital to analog converter module 14. The filter 12 includes a delaying module 16, a summing module 18, and a scaling module 20. The delaying module 16 is operably coupled to receive digital signals 22 and to produce therefrom delayed data 34. The delayed data is provided to the summing module 18 which also is operably coupled to receive the digital signals 22 as data signals 33. The summing module 18 adds the delayed data 34 to the data 32 to produce a resulting output which is provided to the scaling module 20. The scaling module 20 outputs filtered signals 24 to the digital to analog converter 14. The digital to analog converter 14 is operably coupled to a clock circuit $F_s$ 30 and a voltage reference 28.

When the digital signals 22 have a frequency substantially equal to one-half the sampling rate frequency 30, the data signals 32 and delayed data signals 34 are as shown in the timing diagram portion of FIG. 1. As shown, the delay data signals 34 and data signals 32 have a frequency of approximately one-half of the clock signal 30, i.e., the sampling frequency of the digital to analog converter 14. Further note that the delayed data 34 is delayed by a clock cycle with respect to data signals 32. With this type of delay, the delayed data signals 34 are substantially 180 degrees out of phase with respect to data signals 32. In this illustration, the output of the summing module 18 is substantially a zero output.

The scaling module 20 produces the filtered signals 24, which are substantially zero. The digital to analog converter 14, as such, outputs an analog signal 26 that is representative of a zero digital filtered signals 24. The analog signal is produced in part based on the clock signal 30 and the voltage reference 28. Note that due to practical limitations of the components used in analog to digital converters and also in Sigma Delta analog to digital converters, the voltage reference 28 may have noise imposed thereon that is substantially, or approximately, equal to one-half the sampling rate frequency. Without the filter 12, the digital signals 22 which are substantially equal to one-half the sample rate frequency when combined with the noise on the voltage reference 28 will produce an analog noise components of analog signal 26. Such can be derived by the equation $\cos(\omega_1 t * \omega_2 t) = \frac{1}{2}\{(\cos \omega_1 t - \cos \omega_2 t) + (\cos \omega_1 t + \cos \omega_2 t)\}$. As such, a difference between the frequency of the digital signals 22 and the noise signals on the voltage reference cause the output noise components in the analog signals. When this frequency difference is less than 20 kilohertz, the noise is in the audio range and may be rendered audible by subsequent audible rendering circuitry. By incorporating filter 12, the frequency components provided by the digital signal 22 are substantially eliminated thereby substantially reducing the noise components that have frequencies near one-half the sampling frequency. As one in the average skill in the art would appreciate, as the frequency of the data signal 22 changes, the filter 12 will pass, substantially unattenuated, the components having frequencies away from one-half the frequency sampling rate. In other words, filter 12 forms a notch filter that substantially attenuates components of the digital signal 22 near one-half the sampling rate and passes substantially unattenuated components having frequencies outside of the notched filter. As one of average skill in the art will also appreciate, digital signals, especially square wave signals are comprised of a plurality of sinusoidal components to produce the resulting square wave. As such, the sinusoidal signals that have frequency components near one-half the sampling rate frequency will be attenuated by filter 12.

Figure 2:
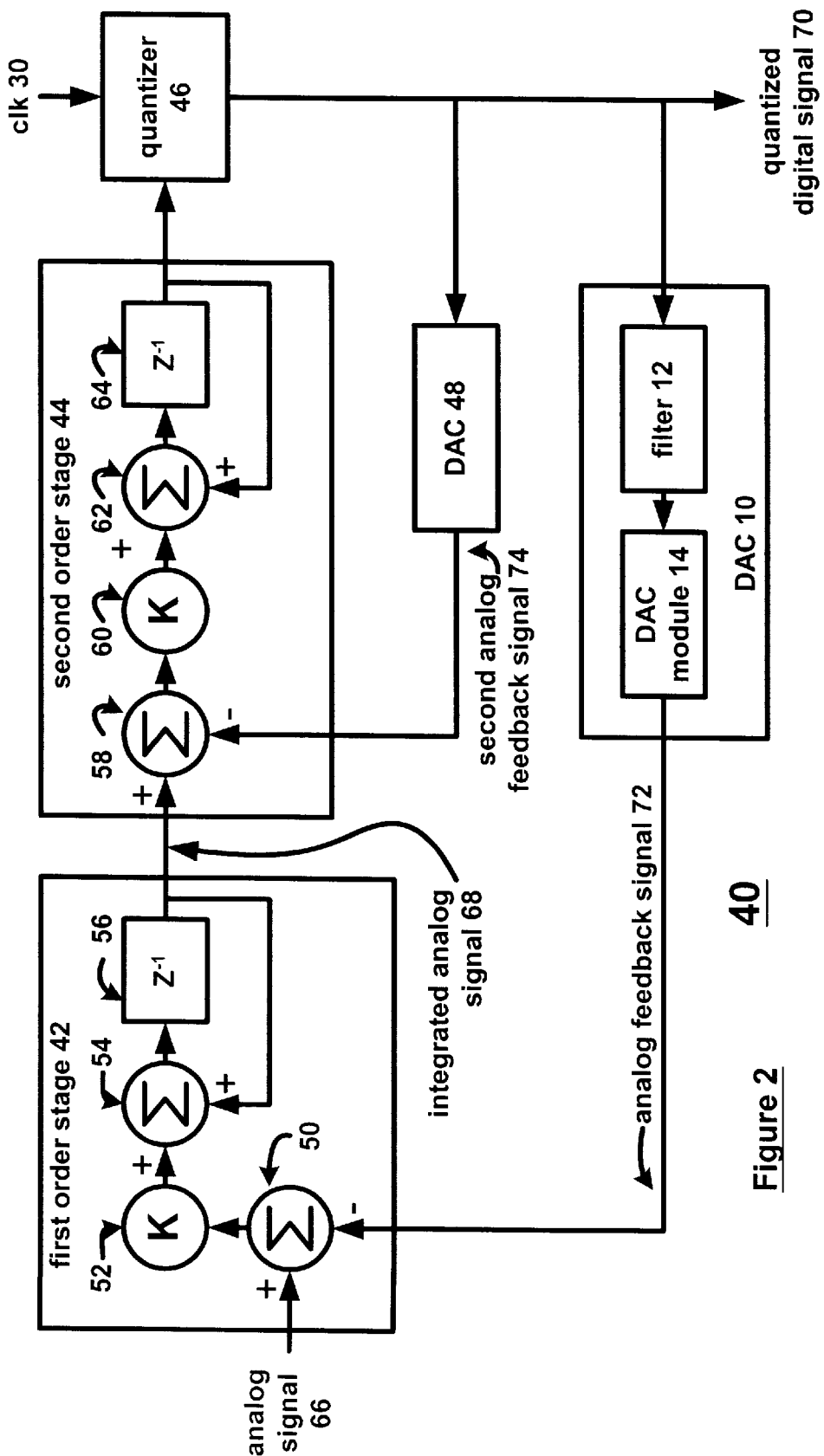
FIG. 2 illustrates a schematic block diagram of a second order Sigma Delta Modulator in accordance with the present invention.

FIG. 2 illustrates a schematic block diagram of a Sigma Delta Analog to Digital Converter 40. The analog to digital converter 40 includes a first order stage 42, a second order stage 44, a quantizer 46, a second digital to analog converter feedback module 48 and the digital to analog converter 10 functioning as a first digital to analog converter feedback module. In general, the first order stage 42 produces an integrated analog signal 68 of input analog signal 66. To do this, the first order stage 42 includes a first summing node 50 that subtracts an analog feedback signal 72 from the analog signal 66. The resulting signal is then provided to a constant module 52 that multiples the resultant signal by a constant. The resulting signal is provided to a second summing module 54 that sums the constant signal with a feedback signal of the integrated analog signal 68. The integrated analog signal 68 is produced by integrator 56. The second order stage 44 produces a second order integrated analog signal that is provided to quantizer 46. The second order stage includes a first summing module 58 that subtracts a second analog feedback signal 74 from the integrated analog signal 68. The resulting signal is provided to a constant module 60 and is subsequently provided to a second summing module 62. The second order stage 44 also includes an integrator 64 that produces a feedback signal, which is provided to the second summing module 62, and outputs the second order integrated analog signal.

The quantizer 46 is operably coupled to receive the second order integrated analog signal and, based on the clock signal 30 which equals the sampling rate, produces the quantized digital signal 70. The quantized digital signal 70 is fed back through DAC 48 to produce the second analog feedback signal 74. In addition, the quantized digital signal 70 is fed back through DAC 10 to produce the analog feedback signal 72. As one of average skill in the art would appreciate, the second order Sigma Delta Modulator of FIG. 2 may be a first order Sigma Delta Modulator by removing the second order stage 44 and the corresponding feedback DAC 48. As one of average skill in the art would further appreciate, the Sigma Delta Modulator may include a third or fourth quarter stage and corresponding feedback DACs to increase the order of the Sigma Delta Modulator. Note that the DAC module 10, which was illustrated in the FIG. 1, is included only in the feedback path to the first order stage. This is in accordance with the preferred embodiment, however, the DAC module 10 may also be utilized in the feedback path to produce the second analog feedback signal 74.

Figure 3:
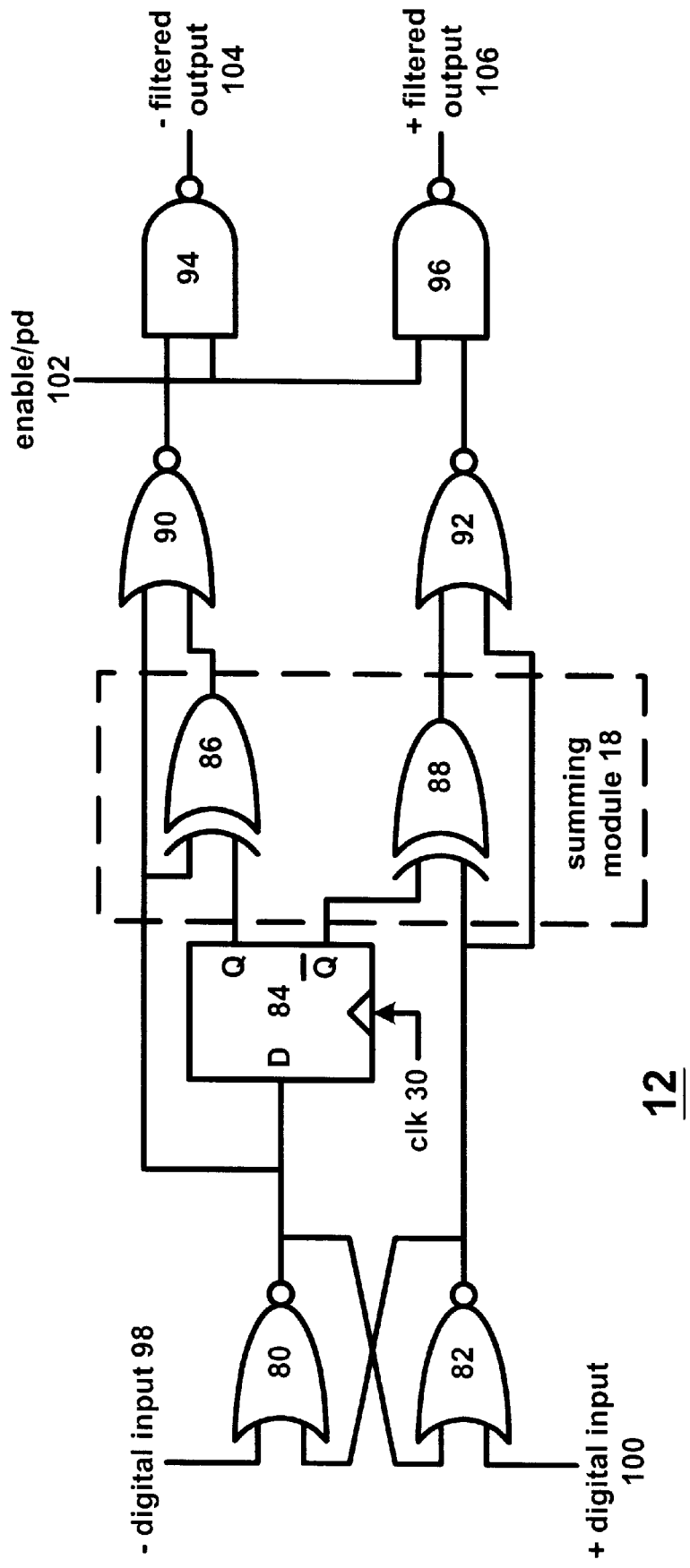
FIG. 3 illustrates a schematic block diagram of the filter of FIGS. 1 and 2.

FIG. 3 illustrates a schematic block diagram of filter 12 for a differential filtering circuit. The digital input signals are received as a positive digital input 100 and a negative digital input 98 by a latch produced by NOR gates 80 and 82. The output of NOR gate 80 is provided to a D flip-flop 84 which functions as the delaying module 16. The output of NOR gate 82 is provided to the summing module 18 which includes a pair of exclusive OR gates 86 and 88. The exclusive OR gates 86 and 88 are operably coupled to receive the q and q complement outputs of the D flip-flop 84 and the output of the NOR gates 80 and 82 as shown. The filter 12 fully includes NOR gates 90 and 92 that are operably coupled to receive the outputs of exclusive OR gates 86 and 88 as shown and the outputs of NOR gates 80 and 82. The outputs of NOR gates 90 and 92 are provided to NAND gates 94 and 96. The other inputs of NAND gates 94 and 96 are coupled to an enabled and/or power down signal 102. When the enable and/or power down signal is low, the resulting filtered outputs 104 and 106 are produced. During a power down state or a non-enable state, the input to NAND gates 94 and 96 are high thereby disabling the outputs.

Figure 4:
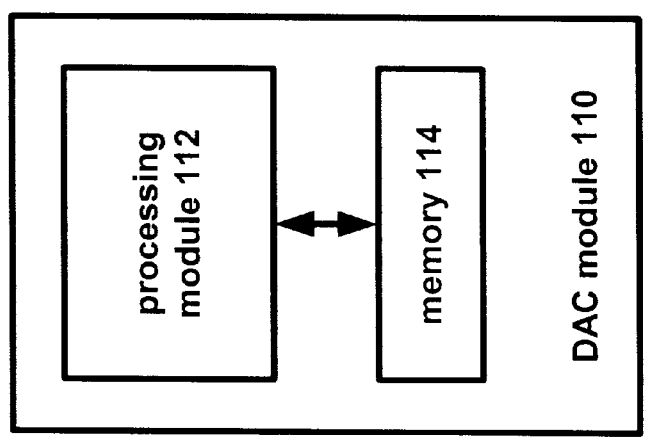
FIG. 4 illustrates a schematic block diagram of an alternate digital to analog converter in accordance with the present invention.

FIG. 4 illustrates a schematic block diagram of a digital to analog conversion module 110 that includes a processing module 112 and memory 114. The processing module 112 may be a single processing entity or a plurality of processing entities. Such a processing entity may be a microprocessor, microcontroller, digital signal processor, microcomputer, central processing unit, state machine, logic circuitry, and/or any device that manipulates digital information based on operational instructions. The memory 114 may be a single memory device or a plurality of memory devices. Such a memory device may be read-only memory, floppy disk memory, random access memory, system memory, hard drive memory, external memory, magnetic tape memory, CD memory, and/or any device that stores digital information. Note that when the processing module includes logic circuitry and/or state machine to perform one or more of its functions, the memory storing the corresponding operational instructions is embedded into the circuitry comprising the state machine and/or logic circuitry. The operational instructions performed by the processing module 112 and stored in memory 115 are described with reference to FIG. 5.

Figure 5:
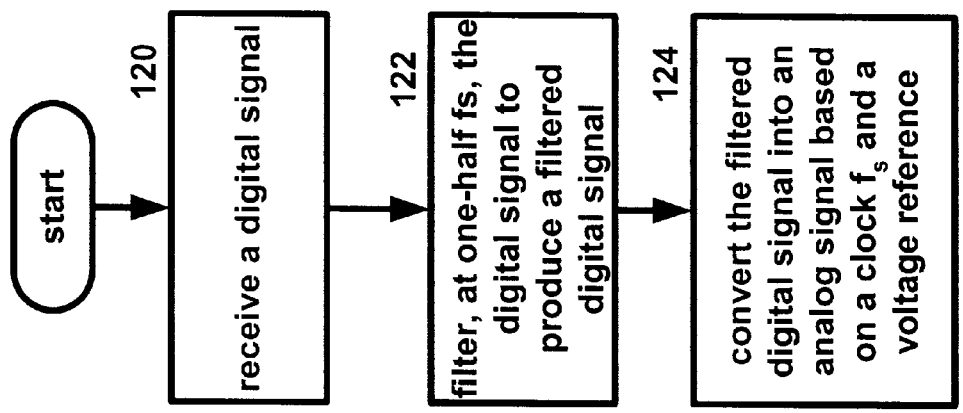
FIG. 5 illustrates a logic diagram of a method for converting digital to analog signals in accordance with the present invention.

FIG. 5 illustrates a logic diagram of a method for digital to analog conversion having low noise. The process begins at step 120 where a digital signal is received. The process then proceeds to step 122 where the digital signal is filtered at one-half the sampling frequency to produce a filtered digital signal. The filtering may be done by delaying the digital input signal to produce delay digital input signals. The delayed digital input signals are then summed with the digital input signals to produce a summed digital signals. The summed digital signals are then scaled to produce the digital signals. The process then proceeds to step 124 where the filtered digital signals are converted into analog signals based on a clock having a frequency of the sampling frequency and a voltage reference.

The preceding discussion has presented a method and apparatus for digital to analog conversions that have reduced noise. Such digital to analog conversions may be implemented in Sigma Delta analog to digital converters in the feedback path. By including a filter in the feedback path, noise generated at one-half the sampling rate when the analog input is a DC value is substantially reduced, thereby enabling a low noise digital to analog converter to be produced as well as a low noise Sigma Delta analog to digital converter.

What is claimed is:

1. A digital to analog converter comprises:

a filter operably coupled to receive digital input signals and to output filtered digital signals, wherein the filter attenuates components of the digital input signals having frequencies near half a sampling frequency and passes, substantially unattenuated, other components of the digital input signals having frequencies away from half the sampling frequency; and digital to analog converter module operably coupled to receive the filtered digital signals, wherein the digital to analog converter module, based on a clock signal having the sampling frequency and a voltage reference, generates analog signals from the filtered digital signals, such that, when the digital input signals are substantially comprised of components near half of the sampling frequency, the analog signals have minimal noise components having frequencies near half the sampling frequency.

2. The digital to analog converter of claim 1, wherein the filter further comprises:

a delaying module operably coupled to receive the digital input signals and to produce therefrom delayed digital signals;

a summing module operably coupled to sum the digital input signals and the delayed digital signals to produce summed digital signals; and a scaling module operably coupled to scale the summed digital signals to produce the filtered digital signals.

3. The digital to analog converter of claim 2, wherein the summing module further comprises at least one exclusive OR gate.

4. The digital to analog converter of claim 2, wherein the delaying module further comprises at least one D flip-flop.

5. A sigma-delta modulator comprises:

a first order stage operably coupled to receive an analog input signal and a first analog feedback signal and to produce therefrom an integrated analog signal;

quantizer operably coupled to receive a representation of the integrated analog signal and to produce therefrom a quantized digital signal; and digital to analog converter operably coupled to receive the quantized digital signal and to produce therefrom the first analog feedback signal, wherein the digital to analog converter includes:

a filter operably coupled to receive the quantized digital signal and to output a filtered digital signal, wherein the filter attenuates components of the quantized digital signal having frequencies near half a sampling frequency and passes, substantially unattenuated, other components of the quantized digital signal having frequencies away from half the sampling frequency; and digital to analog converter module operably coupled to receive the filtered digital signal, wherein the digital to analog converter module, based a clock signal having the sampling frequency and a voltage reference, generates the first analog feedback signal from the filtered digital signal.

6. The sigma-delta modulator of claim 5 further comprises:

a second order stage operably coupled to receive the integrated analog signal and a second analog feedback signal and to produce therefrom a second integrated analog signal; wherein the quantizer operably coupled to receive the second integrated analog signal and to produce therefrom the quantized digital signal; and a second digital to analog converter operably coupled to receive the quantized digital signal and to produce therefrom the second analog feedback signal.

7. The sigma-delta modulator of claim 5, wherein the filter further comprises:

a delaying module operably coupled to receive the digital input signals and to produce therefrom delayed digital signals;

a summing module operably coupled to sum the digital input signals and the delayed digital signals to produce summed digital signals; and a scaling module operably coupled to scale the summed digital signals to produce the filtered digital signals.

8. A method for converting a digital signal into an analog signal, the method comprises the steps of:

receiving the digital signal;

filtering the digital signal to produce a filtered digital signal, wherein the filtering attenuates components of the digital signal having frequencies near half a sampling frequency to produce an attenuated digital signal and passes, substantially unattenuated, other components of the digital signal having frequencies away from half the sampling frequency; and converting the filtered digital signal, based a clock signal having the sampling frequency and a voltage reference, into the analog signal, such that, when the digital signal is substantially comprised of components near half of the sampling frequency, the analog signal has minimal noise components having frequencies near half the sampling frequency.

9. The method of claim 8, wherein the filtering further comprises:

delaying the digital input signals to produce delayed digital signals;

summing the digital input signals and the delayed digital signals to produce summed digital signals; and scaling the summed digital signals to produce the filtered digital signals.

10. A digital to analog converting module comprises:

a processing module; and memory operably coupled to the processing module, wherein the memory stores operational instructions that cause the processing module to receive a digital signal, filter the digital signal to produce a filtered digital signal, wherein the filtering attenuates components of the digital signal having frequencies near half a sampling frequency to produce an attenuated digital signal and passes, substantially unattenuated, other components of the digital signal having frequencies away from half the sampling frequency; and convert the filtered digital signal, based a clock signal having the sampling frequency and a voltage reference, into the analog signal, such that, when the digital signal is substantially comprised of components near half of the sampling frequency, the analog signal has minimal noise components having frequencies near half the sampling frequency.

11. The digital to analog converting module of claim 10, wherein the memory further comprises operational instructions that cause the processing module to:

delay the digital input signals to produce delayed digital signals;

sum the digital input signals and the delayed digital signals to produce summed digital signals; and scale the summed digital signals to produce the filtered digital signals.

* * * * *